United States Patent [19]
Chun

[11] Patent Number: 5,849,609
[45] Date of Patent: Dec. 15, 1998

[54] SEMICONDUCTOR PACKAGE AND A METHOD OF MANUFACTURING THEREOF

[75] Inventor: Heung Sup Chun, Choongchungbook-Do, Rep. of Korea

[73] Assignee: LG Semicon Co., Ltd., Cheongju, Rep. of Korea

[21] Appl. No.: 579,691

[22] Filed: Dec. 28, 1995

[30] Foreign Application Priority Data

Mar. 28, 1995 [KR] Rep. of Korea .................... 1995 6716

[51] Int. Cl.⁶ .................................................. H01L 21/44
[52] U.S. Cl. ............................................ 438/125; 438/612
[58] Field of Search .................................. 437/207, 209, 437/211; 438/125, 612

[56] References Cited

U.S. PATENT DOCUMENTS

| | | | |
|---|---|---|---|
| 5,280,194 | 1/1994 | Richards et al. | 257/724 |
| 5,284,287 | 2/1994 | Wilson et al. | 228/180.2 |
| 5,323,535 | 6/1994 | Sakaki et al. | 437/209 |
| 5,355,283 | 10/1994 | Marrs et al. | 361/760 |
| 5,361,491 | 11/1994 | Oomachi et al. | 437/209 |
| 5,468,999 | 11/1995 | Lin et al. | 257/784 |
| 5,498,575 | 3/1996 | Onishi et al. | 437/209 |
| 5,600,884 | 2/1997 | Kondo et al. | 437/209 |
| 5,620,129 | 4/1997 | Rogren | 228/56.3 |

*Primary Examiner*—Brian Dutton
*Assistant Examiner*—Michael S. Lebentritt
*Attorney, Agent, or Firm*—Fleshner & Kim

[57] ABSTRACT

An improved semiconductor package includes an insulating film carrying conductive balls disposed between a substrate and a printed circuit board. The conductive balls mounted in the insulating film are precisely connected to lower surfaces of conductive patterns formed at the substrate and pads of the printed circuit board. A method for mounting the improved semiconductor package on the printed circuit board includes aligning a package having a plurality of exposed electrical connect terminals with upper surfaces of a plurality of conductive balls formed in an insulating film, aligning lower surfaces of the conductive balls with a plurality of pads formed on the printed circuit board, and electrically connecting the exposed electrical connect terminals, the ends of the conductive balls and the pads of the printed circuit board by a reflow process.

10 Claims, 4 Drawing Sheets

FIG. 5
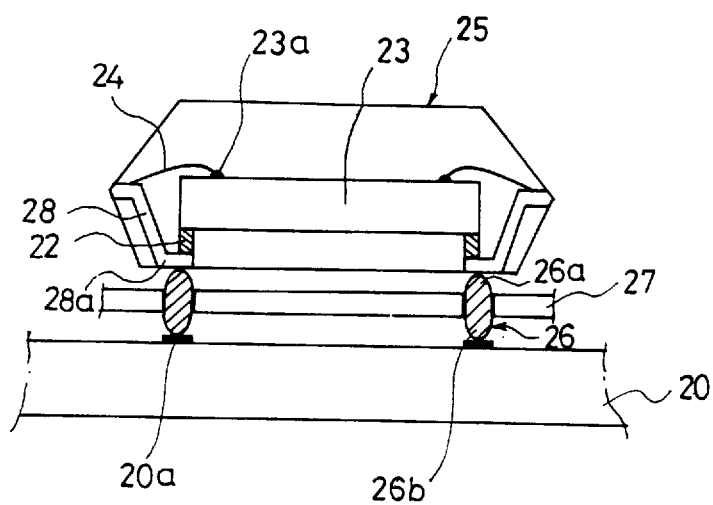
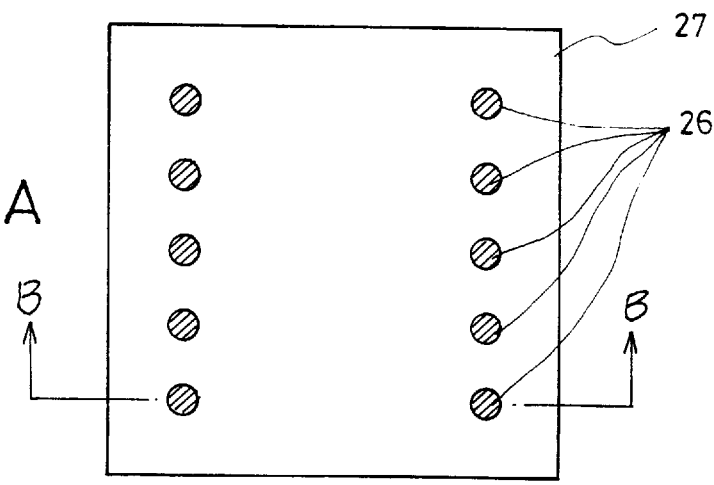
FIG.6A
FIG.6B
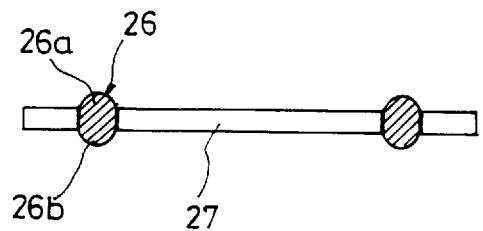

SEMICONDUCTOR PACKAGE AND A METHOD OF MANUFACTURING THEREOF

BACKGROUND OF THE INVENTION

1. Field of the Invention

The present invention relates to a semiconductor package and a method of manufacturing thereof, and more particularly, to an improvement of a semiconductor package structure mounted on an insulating film having conductive balls and a method for attaching an insulating film having conductive balls between a substrate and a printed circuit board and a method of manufacturing the improved package structure.

2. Description of the Conventional Art

Up to now, a QFP (Quad Flat Package) has been widely used in LSI (Large Scale Integrated) circuit packages. Compared with the widely used QFP (Quad Flat Package), a BGA (Ball Grid Array) package allows for more than twice as many leads and a lead pitch three times smaller than a QFP of similar size.

QFP pins are thin and become more easily bent in view of gradually decreasing the pin pitch of the QFPs. The QFPs have fragile gull-wing leads and require careful handling by skilled workers on assembly lines. For example, outer leads of the QFPs are very small, especially as the lead pitch decreases due to a high-lead count for increasing the number of leads and alignment and controlling an amount of solder upon mounting the QFPs on a printed circuit board are difficult.

In contrast, BGA packages use solid solder balls for leads, and are easier to handle. That is, the BGA packages are subject to far fewer soldering defects than QFPs. Since solder balls are used as leads, there is almost no need to worry about lead deformation. The BGA packages are smaller than the widely used QFPs in external dimensions, and can be easily soldered to printed circuit boards. Therefore, BGA packages outperform the QFPs in mass producibility.

In the BGA packages, an electrical path from a semiconductor chip to a solder ball is very short, so that it is easy to achieve an improved electrical characteristic by reducing the electrical resistance.

Now, a conventional BGA packages will be described with reference to FIGS. 1 and 2.

FIGS. 1 and 2 illustrate a conventional BOA package. In the illustrated BGA package, a solder resist film 9 which is mounted on upper and lower surfaces of a substrate 1, is attached by adhesive materials(not shown). A semiconductor chip 3 is attached on an upper surface of the substrate 1 by an adhesive 2 and through holes 8 are formed at predetermined portions of the substrate 1. Inside each through hole 8, there is provided a conductive pattern 5. Pads 3a formed on the semiconductor chip 3 are electrically connected to an upper surface 5a of the respective conductive patterns 5 by bonding wires 4. Also, solder balls 6 are formed on a lower surface 5b of the conductive patterns 5.

After performing a wire bonding process as described above, the BOA packages are molded by EMC (Epoxy Molding Compound) 7. The solder balls 6 are formed and mounted on the lower surface of substrate 1 and aligned with a regular gap from each other by being heated to the point of reflow to permit the solder 6 deposits to transfer into wetted contact with the conductive patterns of substrate 1 by a solder reflow process.

FIG. 2 is a sectional view showing a mounting state of a conventional BGA package which is attached by solder balls between the package substrate and the printed circuit boards.

A method for mounting a conventional BGA package on a printed circuit board is as follows.

To mount the BGA package on the printed circuit board 10, the BGA package is aligned with pads 10a on the printed circuit board 10. The solder balls 6 are electrically connected to the pads 10a formed on an upper surface of the printed circuit boards 10 by a solder reflow process.

The conventional method for mounting the BGA package on the printed circuit board 10 includes a first reflow process for attaching one end of the solder balls 6 to the conductive patterns 5, and a second reflow process for attaching the other ends of the solder balls 6 to the pads 10a of the printed circuit board 10. That is, in the conventional method for mounting the BGA package on the printed circuit board, at least two reflow processes are required, and thus the total processing is complicated.

If the BGA package structure as shown in FIG. 1 is adopted for mounting a semiconductor element, the semiconductor fabrication process will be complicated by the two reflow process steps.

When the solder balls are positioned with poor precision on the printed circuit board, repairs thereof are not so easy.

SUMMARY OF THE INVENTION

It is an object of this invention to provide an improved BGA package structure for permitting mounting of a BGA package on the printed circuit board by one reflow process.

It is another object of this invention to provide a semiconductor package structure in which an electrical terminal exposed from a lower surface of an epoxy molding compound of the semiconductor package is connected to conductive balls formed on an insulating film.

It is still a further object of this invention to provide a method of manufacturing a semiconductor package which can use conductive balls to be attached between a substrate of the package and the printed circuit board by one reflow process, thereby lending itself to mass-production because of its easy and simple process requirements.

According to the present invention, an improved BGA package structure is provided using an insulating film having conductive balls. The invention comprises a BGA package without solder balls, an insulating film having a plurality of conductive balls, upper surfaces of the conductive balls being electrically connected to electrical connection terminals of the semiconductor package, and a printed circuit board having a plurality of pads, the pads being electrically connected to lower surfaces of the conductive balls.

According to the present invention, a method for reducing the contact failure of the conductive balls between the substrate and the printed circuit board is also provided. The method for reducing the contact failure of the conductive balls comprises the steps of aligning a package having a plurality of exposed electrical connection terminals with upper surfaces of a corresponding plurality of conductive balls formed on an insulating film, aligning lower surfaces of the conductive balls with a corresponding plurality of pads formed on a printed circuit board, and electrically connecting the exposed electrical connection terminals, the conductive balls and the pads on the printed circuit board by a reflow process.

An improved semiconductor package according to the present invention comprises a semiconductor package structure having an electrical connection terminal exposed from an epoxy molding compound, an insulating film having a plurality of conductive balls, and a printed circuit board having a plurality of pads.

According to the present invention, there is also provided a method for manufacturing a semiconductor package having a conductive ball, comprising the steps of attaching a semiconductor chip having a plurality of pads to a substrate having a plurality of conductive patterns, electrically connecting the pads of the semiconductor chip with upper surfaces of the conductive patterns, molding the semiconductor chip and the upper surfaces of the conductive patterns, aligning lower surfaces of a plurality of conductive balls formed on a insulating film with a corresponding plurality of pads formed on a printed circuit board, aligning lower surfaces of the conductive patterns of the substrate with corresponding upper surfaces of the plurality of conductive balls formed on the insulating film together, electrically connecting the connective patterns of the substrate, the conductive balls and pads on the printed circuit board by a reflow process.

BRIEF DESCRIPTION OF THE DRAWINGS

FIG. 5 is a sectional view showing a BLP (Bottom Lead Package) according to a second embodiment of the present invention.

FIG. 6A is a top view showing an insulating film according to the second embodiment of this invention.

FIG. 6B is a sectional view taken along the line B—B shown in FIG. 6A.

DESCRIPTION OF THE PREFERRED EMBODIMENTS

Detailed description of preferred embodiments of the present invention is disclosed hereinafter. It should be understood, however, that the disclosed embodiments are merely exemplary of the invention, which may be embodied in various forms. Therefore, specific structures (for example, BGA packages or BLP packages having an electrical connection terminal exposed from a lower surface of the packages) is described by way of illustration, but it is contemplated to employ various similar type package structure.

Figure 3:
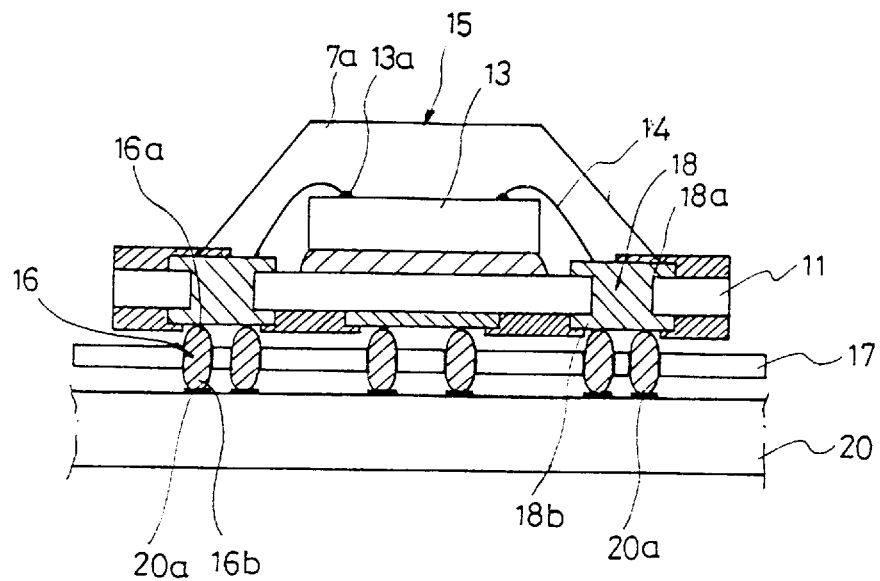
FIG. 3 is a sectional view showing an improved BGA package according to a first embodiment of the present invention.

Referring to FIG. 3, a basic construction of a BGA package according to the present invention is illustrated. A BGA package 15 is formed and aligned with an insulating film 17 having conductive balls 16 to be mounted between a lower surface of the BGA package 15 and an upper surface of a printed circuit board 20. Also, the BGA package 15 formed without outer leads and is to be mounted on the conductive balls 16. In general, the conductive balls 16 should have a good electrical connection property and are formed from a material such as a solder.

Figure 4A:
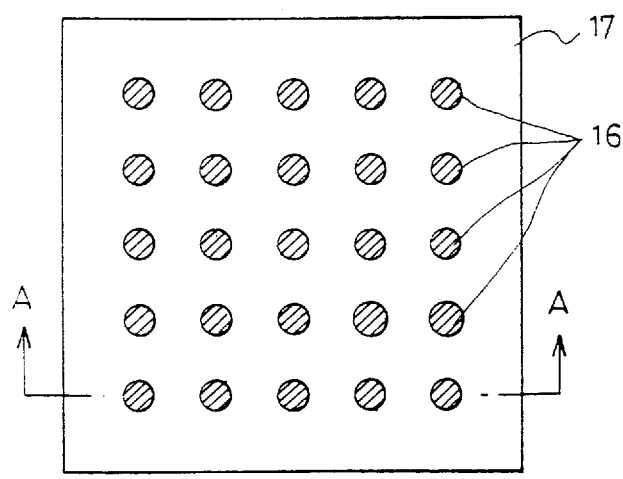
FIG. 4A is a top view showing an insulating film having conductive balls according to the first embodiment of this invention.

Now, referring to FIGS. 4A–4E, description will be made as to the improved BGA structure having the insulating film 17. The insulating film 17 includes conductive balls 16, which are usually spaced with a regular pitch as shown in FIG. 4A. That is, the insulating film 17 includes conductive balls 16 to be mounted on the printed circuit boards 20. Also, the insulating film 17 is made for example of a polyimide material.

Figure 4B:
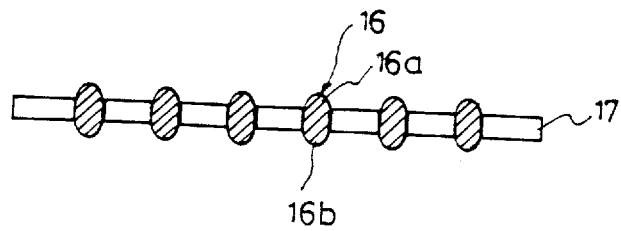
FIG. 4B is a sectional view taken along the line A—A shown in FIG. 4A.

Each of the conductive balls 16 has an upper surface 16a and a lower surface 16b as shown in FIG. 4B. Conductive balls 16 are to be mounted on the printed circuit board 20 instead of the solder balls 6 of the conventional BGA package. The conductive balls 16 are inserted through the insulating film 17.

Between the printed circuit board 20 on which the BGA package 15 is to be mounted, and the BGA package it is necessary to provide the insulating film 17 having conductive balls 16 aligned with a regular pitch as shown in FIG. 4A.

As the conductive balls 16 according to a first embodiment of the present invention are inserted in the insulating film 17 in view of the known technology of using conventional solder balls as package leads, total manufacturing processes are made very simple by reducing an aligning or array process.

Figure 4C:
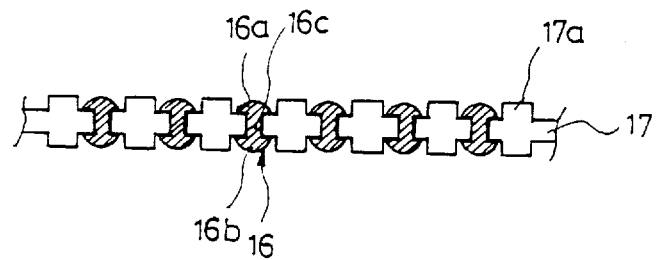
FIG. 4C is a sectional view showing a modified insulating film.
Figure 4D:
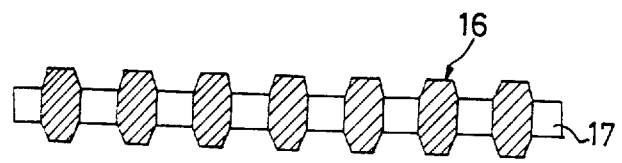
FIG. 4D is a sectional view showing a different modified insulating film.
Figure 4E:
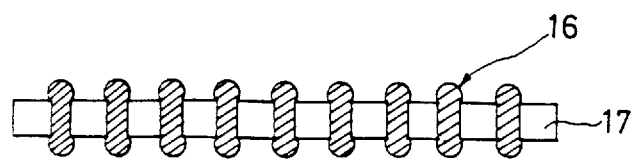
FIG. 4E is a sectional view showing another modified insulating film.

To reduce the failure of the attachment of the conductive balls 16, the insulating film 17 may be formed with a protrusion portion 17a between conductive balls 16 as shown in FIG. 4C. Also, intermediate portions 16c are formed between upper surfaces 16a and lower surfaces 16b of the conductive balls 16. This is the most desirable configuration to prevent separation of the conductive balls 16 from the insulating film 17. Hence, the configurations of the conductive balls 16 are formed and shaped as an ellipse type, a dumbbell type, or a polygon type, as shown in FIGS. 4C, 4D and 4E.

Now, a description will be made as to a method for mounting the BGA package on the printed circuit board 20 and a method of manufacturing the BGA package illustrated in FIG. 3.

As illustrated in FIG. 3, the substrate 11 and the printed circuit board 20 are disposed in a face-to-face relationship.

First, a method for mounting the substrate 11 to the printed circuit board 20 includes the steps of:

a) aligning lower surfaces 18b of the plurality of conductive patterns 18 of the package 15 with upper surfaces 16a of a corresponding plurality of conductive balls 16 formed on the insulating film 17, b) aligning lower surfaces 16b of the conductive balls 16 with a corresponding plurality of pads 20a formed on the printed circuit board 20, and c) electrically connecting the exposed lower surfaces 18b, the conductive balls 16 and the pads 20a of the printed circuit board 20 by a reflow process.

Also, in the mounting method, the step (c) is able to proceed before the step (b) for aligning, the lower surfaces 16b with pads 20a, after proceeding the step (a) for aligning the lower surfaces 18b of the package 15 with upper surfaces 16a of the conductive balls 16.

That is, the mounting method employing the conductive balls 16 according to the present invention may be accomplished by connecting the lower surfaces 18b of the conductive patterns 18 formed on substrate 11 or pads 20a of the printed circuit board 20 in turn with regard to a selected portion (for example, the upper surfaces 16a or the lower surfaces 16b of the conductive balls 16 as shown in FIG. 4B) as desired by a user.

Now, a method of manufacturing a semiconductor package having a conductive ball according to a first embodiment of this invention, includes the steps of:

a) attaching the semiconductor chip 13 having a plurality of pads 13a by adhesive 12 to the substrate 11 having the plurality of conductive patterns 18, b) electrically connecting the pads 13a formed on the semiconductor chip 13 and the upper surfaces 18a of the conductive patterns;

c) molding the semiconductor chip 13 and the upper surfaces 18a of the conductive patterns 18;

d) aligning lower surfaces 16b of the plurality of conductive balls 16 formed in the insulating film 17 with the corresponding plurality of pads 20a formed on the printed circuit board 20;

e) aligning the lower surfaces 18b of the conductive patterns 18 formed on the substrate 11 with the corresponding upper surfaces 16a of the plurality of conductive balls 16 formed on the insulating film 17 together;

f) electrically connecting the exposed lower surfaces 18b, the conductive balls 16 and the pads 20a on the printed circuit board 20 by a reflow process.

Also, the molding step (c) may initially proceed and be followed by the steps of aligning the lower surfaces 18b of the conductive patterns 18 formed on the substrate 11 with the upper surfaces 16 of the plurality of conductive balls 16 formed in the insulating film 17, aligning the lower surfaces 16b of the plurality of conductive balls 16 formed on the insulating film 17 with the plurality of pads 20a formed on the printed circuit board 20, and electrically connecting the lower surfaces 18b, the conductive balls 16 and the pads 20a of the printed circuit board 20 by a reflow process.

Figure 1:
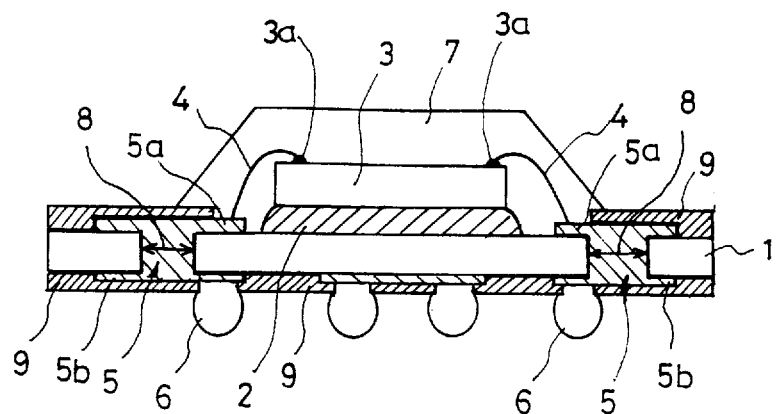
FIG. 1 is a sectional view showing a plastic BGA package known in the conventional art.
Figure 2:
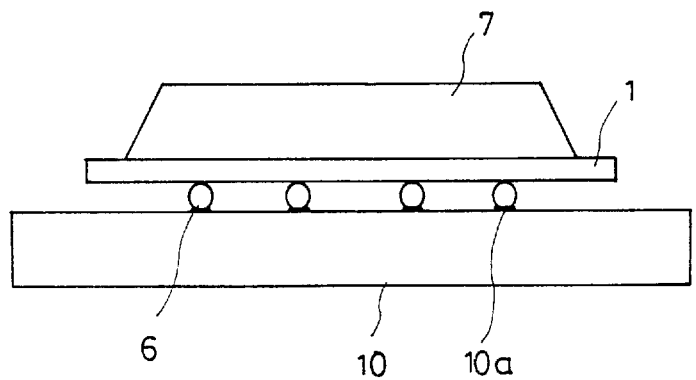
FIG. 2 is a sectional view showing a mounting state of a conventional BGA package which is mounted on a substrate by solder balls to a printed circuit board.

As noted above in the background section of the instant application, the conventional method is disadvantageous in that solder balls 6 (FIG. 1) must be directly attached on the substrate 1 by two reflow process steps. In other words, the precision of the electrical connection relationship between the substrate 1 and the printed circuit board 10 depends upon the self-alignment of the solder balls 1 (FIG. 1). Hence, the self-alignment means that the solder balls naturally align to the solder paste by being melted after proceeding the reflow process even in case that the solder balls are not correctly aligned on the solder paste.

Referring next to FIG. 5, 6A and 6B, description will now be made of a BLP (Bottom Lead Package) according to a second embodiment of the present invention. The BLP 25 is mounted on the printed circuit board 20 by using an insulating film 27 having conductive balls 26.

In an inner structure of the BLP 25 shown in FIG. 5, a semiconductor chip 23 is mounted at a predetermined position of inner leads 28 by an adhesive 22 attached on the inner leads 28. Also, pads 23a of the semiconductor chip 23 are connected to the inner leads 28 by wires 24. After a wiring process step, the semiconductor chip 23 and the inner leads 28 are molded by an EMC (Epoxy Molding Compound).

Also, an outer structure of the BLP 25 is as follows. The inner leads 28 of the BLP 25 have exposed under, surfaces 28a as shown in FIG. 5. The inner leads 28 are connected to upper surfaces 26a of corresponding conductive balls 26.

The conductive balls 26 which are for example aligned in two columns, are inserted in the insulating film 27. The lower surfaces 26b of the conductive balls 26 are directed downwards and are connected to pads 20a of the printed circuit board 20.

In FIG. 6A, a cross-sectional view of insulating film 27 is provided wherein the conductive balls 26 are shown aligned in two columns. While the structure shown in FIG. 6A has two columns of conductive balls 27, and these are usually at the edge of the contact areas of inner leads 28, other configurations are possible. In FIG. 6A a spacing illustration is provided in the form of a schematic top view of a predetermined position array of the conductive balls 26 according to the inner leads 28 exposed from a lower surface of the BLP 25 and pads 20a of the printed circuit board 20.

FIG. 6B is a sectional view taken along the line B—B shown in FIG. 6A. In FIG. 6B, the conductive balls 26 each include an upper surface 26a and a lower surface 26b which protrude from the insulating film 27.

Now, referring again to FIG. 5, description will be made of a method for mounting the BLP package 25 on the printed circuit board 20.

The method for mounting the BLP package 25 on the printed circuit board 20 includes the steps of mounting the semiconductor chip 23 on the inner leads 28 by adhesive 22, electrically connecting pads 23a of the semiconductor chip 23 with the inner leads 28 by wires 24, and molding the semiconductor chip 23 and inner leads 28 by using an EMC (Epoxy Molding Compound).

A predetermined surface 28a of each of inner leads 28 is exposed on a lower surface of the BLP 25 (a lower molded surface of the BLP 25). The lower surfaces 26b of the conductive balls 26 are at first aligned with the pads 20a of the printed circuit board 20. The upper surfaces 26a of the conductive balls 26 are also aligned with the exposed surfaces 28a of the inner leads 28. Thereafter, the exposed surfaces 28a of the inner leads 28, the conductive balls 26 and pads 20a of the printed circuit board 20 are electrically connected by a reflow process. Thus, the insulating film 27 having conductive balls 26 is attached between the BLP 25 and the printed circuit board 20.

In the method of manufacturing the BLP 25 according to the second embodiment of the present invention, the insulating film 27 is attached to the BLP 25 by a reflow process after attaching the insulating film 27 on the printed circuit board 20. The aforementioned reflow process is one step of a known package manufacturing method. Thus, the total manufacturing method of the BLP 25 is very simple because the reflow process step requirement is reduced by one step in comparison with the conventional package manufacturing method which proceeded as two steps. That is, one major advantage of reducing the reflow process is a reduction in the number of total process steps needed to make the BLP 25.

The semiconductor package and the method of manufacturing a BGA package or a BLP have certain features and characteristics arising from the construction and the manufacturing method thereof, in accordance with the invention.

If a connect or contact failure of the conductive balls 26 occurs, the package may be removed from the printed circuit board 20 with ease due to the use of the insulating film 26 having the conductive balls 26 as shown in FIG. 5.

While this invention has thus far been described in conjunction with only two embodiments thereof, it will readily be apparent to those skilled in the art to put this invention into practice in various other manners. For example, the insulating films 17, 27 having conductive balls 16, 26 need not always be attached to the lower surfaces of the packages 15, 25. In other words, the insulating films 17, 27 may be attached to upper surfaces of the packages according to various types of the packages. On the other hand, the conductive balls 16, 26 may not be restricted to the column array as shown in FIGS. 4A and 6A. Also, the size of the conductive balls 16, 26 may change according to a predetermined size rather than a regular size. Furthermore, although only embodiments of a BGA package and a BLP package are provided as illustrations herein, the invention is not limited to the BGA or BLP packages, but is also applicable to various other packages.

What is claimed is:

1. A method of mounting a semiconductor package carrying a semiconductor chip on a printed circuit board, comprising the steps of:
   a) forming a plurality of holes in an insulating film, wherein said holes have walls;
   b) forming a plurality of protruding portions at said walls formed in said insulating film;
   c) forming a conductive media in the holes to extend above the insulating film;
   d) aligning exposed electrical contacts of the semiconductor package with upper surfaces of the conductive media formed in the insulating film;
   e) aligning lower surfaces of the conductive media with a corresponding plurality of pads of a printed circuit board; and
   f) electrically connecting the exposed electrical contacts, the conductive media and the pads of the printed circuit board.

2. The method of claim 1, wherein step (e) is performed before the steps (d) and (f) are performed.

3. The method of claim 1, wherein the exposed electrical contacts, the conductive media and the pads of the printed circuit board are electrically connected by a reflow process.

4. The method of claim 1, wherein the step of aligning lower surfaces of the conductive media comprises aligning lower surfaces of the conductive media that extend below a lower surface of the insulating film with a corresponding plurality of pads of a printed circuit board.

5. A method of manufacturing a semiconductor package, comprising the steps of:
   a) attaching a semiconductor chip having a plurality of contact pads to a substrate having a plurality of conductive patterns;
   b) electrically connecting the contact pads with upper surfaces of the conductive patterns;
   c) molding the semiconductor chip and the upper surfaces of the conductive patterns;
   d) forming a plurality of holes in an insulating film, wherein said holes have walls;
   e) forming a plurality of protruding portions at said walls formed in said insulating film;
   f) forming a conductive media in the holes to extend above the insulating film;
   g) aligning lower surfaces of the conductive media with a corresponding plurality of pads formed on a printed circuit board;
   h) aligning lower surfaces of the conductive patterns of the substrate with upper surfaces of the conductive media; and
   i) electrically connecting the contact pads, the conductive media and the pads on the printed circuit board.

6. The method of claim 5, wherein the contact pads, the conductive media and the pads of the printed circuit board are electrically connected by a reflow process.

7. The method of claim 5, wherein the step of aligning lower surfaces of the conductive media comprises aligning the lower surfaces of the conductive media that extend below a lower surface of the insulating film with pads formed on a printed circuit board.

8. A method of manufacturing a semiconductor package comprising the steps of:
   a) attaching leads to a semiconductor chip;
   b) electrically connecting bonding pads of the semiconductor chip to corresponding ones of the leads;
   c) packaging the semiconductor chip and the leads with a resin such that at least a portion of each of the leads is exposed;
   d) forming a plurality of holes in an insulating film, wherein said holes have walls;
   e) forming a plurality of protruding portions at said walls formed in said insulating film;
   f) forming conductive media in the holes to extend above the insulating film;
   g) aligning exposed portions of the leads with upper surfaces of corresponding ones of the conductive media;
   h) aligning lower surfaces of the conductive media with a corresponding plurality of pads formed on a printed circuit board; and
   i) electrically connecting the leads, the conductive media and the pads of the printed circuit board.

9. The method of claim 8, wherein the leads, the conductive media and the pads of the printed circuit board are electrically connected by a reflow process.

10. The method of claim 8, wherein the step of aligning lower surfaces of the conductive media comprises aligning lower surfaces of the conductive media that extend below a lower surface of the insulating film with a corresponding plurality of pads formed on a printed circuit board.

* * * * *